(12) United States Patent
La Croix et al.

(10) Patent No.: US 8,580,079 B2
(45) Date of Patent: Nov. 12, 2013

(54) ELECTRODE CARRIER ASSEMBLIES

(75) Inventors: Cliff La Croix, Livermore, CA (US);
Armen Avoyan, Glendale, CA (US);
Duane Outka, Fremont, CA (US);
Catherine Zhou, Fremont, CA (US);
Hong Shih, Walnut, CA (US)

(73) Assignee: Lam Research Corporation, Fremont, CA (US)

( * ) Notice: Subject to any disclaimer, the term of this patent is extended or adjusted under 35 U.S.C. 154(b) by 625 days.

(21) Appl. No.: 12/817,699

(22) Filed: Jun. 17, 2010

(65) Prior Publication Data

US 2011/0308732 A1 Dec. 22, 2011

(51) Int. Cl.
*H01J 1/94* (2006.01)
(52) U.S. Cl.
USPC .............. 156/345.45; 156/345.43; 118/723 E
(58) Field of Classification Search
USPC .......... 156/345.1, 345.43, 345.45; 118/723 E
See application file for complete search history.

(56) References Cited

U.S. PATENT DOCUMENTS

| | | | |
|---|---|---|---|
| 2009/0322199 A1 | 12/2009 | Augustino et al. | |
| 2009/0325320 A1* | 12/2009 | Avoyan et al. | 438/4 |
| 2011/0308732 A1* | 12/2011 | La Croix et al. | 156/345.1 |

* cited by examiner

*Primary Examiner* — Sylvia R MacArthur
(74) *Attorney, Agent, or Firm* — Dinsmore & Shohl LLP

(57) ABSTRACT

In accordance with one embodiment of the present disclosure, an electrode carrier assembly is provided including an electrode carrying annulus and a plurality of electrode mounting members. The electrode carrying annulus includes an electrode containment sidewall that forms an inner or outer radius of the electrode carrying annulus. The electrode carrying annulus further includes a plurality of radial sidewall projections that project radially away from the electrode containment sidewall. The radial sidewall projections each include an upward-facing tapered spacer including an upward-facing micro-mesa. The electrode mounting members each include a downward-facing tapered spacer including a downward-facing micro-mesa. The electrode mounting members are rotatably engaged with the electrode carrying annulus, and are configured to rotate between a free position and a bracketed position.

13 Claims, 5 Drawing Sheets

1

ELECTRODE CARRIER ASSEMBLIES

BACKGROUND

The present disclosure relates generally to an electrode carrier for use in handling and processing electrodes and, more particularly, to an electrode carrier assembly for multi-component electrodes that are used as excitation electrodes in plasma processing systems.

SUMMARY

In accordance with one embodiment of the present disclosure, an electrode carrier assembly is provided including an electrode carrying annulus and a plurality of electrode mounting members. The electrode carrying annulus includes an electrode containment sidewall that forms an inner or outer radius of the electrode carrying annulus. The electrode containment sidewall is configured to limit radial movement of an electrode carried by the electrode carrying annulus. The electrode carrying annulus further includes a plurality of radial sidewall projections that project radially away from the electrode containment sidewall. The radial sidewall projections each include an upward-facing tapered spacer. The upward-facing tapered spacer includes an upward-facing micro-mesa. The upward-facing tapered spacer projects upwardly from the radial sidewall projections and defines an upward-decreasing cross sectional area that culminates at the upward-facing micro-mesa. The radial sidewall projections are configured to support the electrode carried by the electrode carrying annulus and resting upon the upward-facing micro-mesa. The electrode mounting members each include a downward-facing tapered spacer. The downward-facing tapered spacer including a downward-facing micro-mesa. The downward-facing tapered spacer projects downwardly from the electrode mounting members and defines a downward-decreasing cross sectional area that culminates at the downward-facing micro-mesa. The electrode mounting members are rotatably engaged with the electrode carrying annulus, and are configured to rotate between a free position and a bracketed position. When in the free position, the downward-facing micro-mesa circumvents an upward projection of the electrode containment sidewall. When in the bracketed position, the downward-facing micro-mesa breaches the upward projection of the electrode containment sidewall and limits upward movement of the electrode carried by the electrode carrying annulus.

In another embodiment, an electrode carrier assembly is provided including an electrode carrying annulus and a plurality of electrode mounting members. The electrode carrying annulus includes an electrode containment sidewall that forms an inner or outer radius of the electrode carrying annulus. The electrode containment sidewall is configured to limit radial movement of an electrode carried by the electrode carrying annulus. The electrode carrying annulus further includes a plurality of radial sidewall projections that project radially away from the electrode containment sidewall. The radial sidewall projections each include an upward-facing micro-mesa. The radial sidewall projections are configured to support the electrode carried by the electrode carrying annulus and resting upon the upward-facing micro-mesa. The electrode mounting members each include a downward-facing micro-mesa, an alternative micro-mesa facing upward, a downward-facing mounting surface and an upward-facing mounting surface. The downward-facing micro-mesa is spaced an upward distance away from the downward-facing mounting surface along an upward direction. The alternative micro-mesa is spaced a downward distance away from the upward-facing mounting surface along a downward direction. The upward distance is different from the downward distance. The electrode mounting members are rotatably engaged with the electrode carrying annulus, and the electrode mounting members are configured to rotate between a free position and a bracketed position. When in the free position, the downward-facing micro-mesa circumvents an upward projection of the electrode containment sidewall. When in the bracketed position, the downward-facing micro-mesa breaches the upward projection of the electrode containment sidewall and limits upward movement of the electrode carried by the electrode carrying annulus.

In yet another embodiment, an electrode carrier assembly is provided including an electrode carrying annulus, a plurality of electrode mounting members, and a plurality of hand-operated screws. The electrode carrying annulus includes an electrode containment sidewall that forms an inner or outer radius of the electrode carrying annulus. The electrode containment sidewall is configured to limit radial movement of an electrode carried by the electrode carrying annulus. The electrode carrying annulus further includes a top surface, upward-facing planar depressions disposed within the top surface and a plurality of radial sidewall projections that project radially away from the electrode containment sidewall. The radial sidewall projections each include an upward-facing tapered spacer. The upward-facing tapered spacer includes an upward-facing micro-mesa, and the upward-facing tapered spacer projects upwardly from the radial sidewall projections to define an upward-decreasing cross sectional area that culminates at the upward-facing micro-mesa. The radial sidewall projections are configured to support the electrode carried by the electrode carrying annulus and resting upon the upward-facing micro-mesa. The electrode mounting members each include a downward-facing tapered spacer. The downward-facing tapered spacer includes a downward-facing micro-mesa. The downward-facing tapered spacer projects downwardly from the electrode mounting members and defines a downward-decreasing cross sectional area that culminates at the downward-facing micro-mesa. The hand-operated screws provide a clamping force that clamps the electrode mounting members to the electrode carrying annulus. The clamping force is adjusted by rotating the hand-operated screws. The electrode mounting members are rotatably engaged with the electrode carrying annulus, and the electrode mounting members are configured to rotate between a free position and a bracketed position. When in the free position, the electrode mounting members pivot upon the top surface, and the downward-facing micro-mesa circumvents an upward projection of the electrode containment sidewall. When in the bracketed position, the electrode mounting members pivot upon the upward-facing planar depressions, and the downward-facing micro-mesa breaches the upward projection of the electrode containment sidewall and limits upward movement of the electrode carried by the electrode carrying annulus. Additional embodiments of broader and narrower scope are contemplated.

BRIEF DESCRIPTION OF THE SEVERAL VIEWS OF THE DRAWINGS

The following detailed description of specific embodiments can be best understood when read in conjunction with the following drawings, where like structure is indicated with like reference numerals and in which.

DETAILED DESCRIPTION

As is noted above, the present disclosure relates to an electrode carrier assembly for multi-component electrodes. The concepts of the present disclosure should not be limited to particular electrode or electrode assembly configurations. Although the present disclosure is not limited to particular types of electrodes or the context in which the electrodes to be carried have been used, for the purposes of illustration, the carrier is illustrated herein with reference to silicon-based electrode assemblies such as a disc-shaped, inner multi-component showerhead electrode and a ring-shaped, outer multi-component electrode. Further teachings regarding the structure of electrode assemblies similar to that illustrated in FIGS. 1-2 can be found in US Pub. No. 2009/0322199, pertinent portions of which are incorporated herein by reference.

Although the particular features of the electrode carrier assembly illustrated herein may vary, particular configurations according to the present disclosure are illustrated herein with reference to FIGS. 1-4B. Generally, the electrode carrier assembly 100, 101 comprises an electrode carrying annulus 110, 210 and a plurality of electrode mounting members 130.

Figure 1:
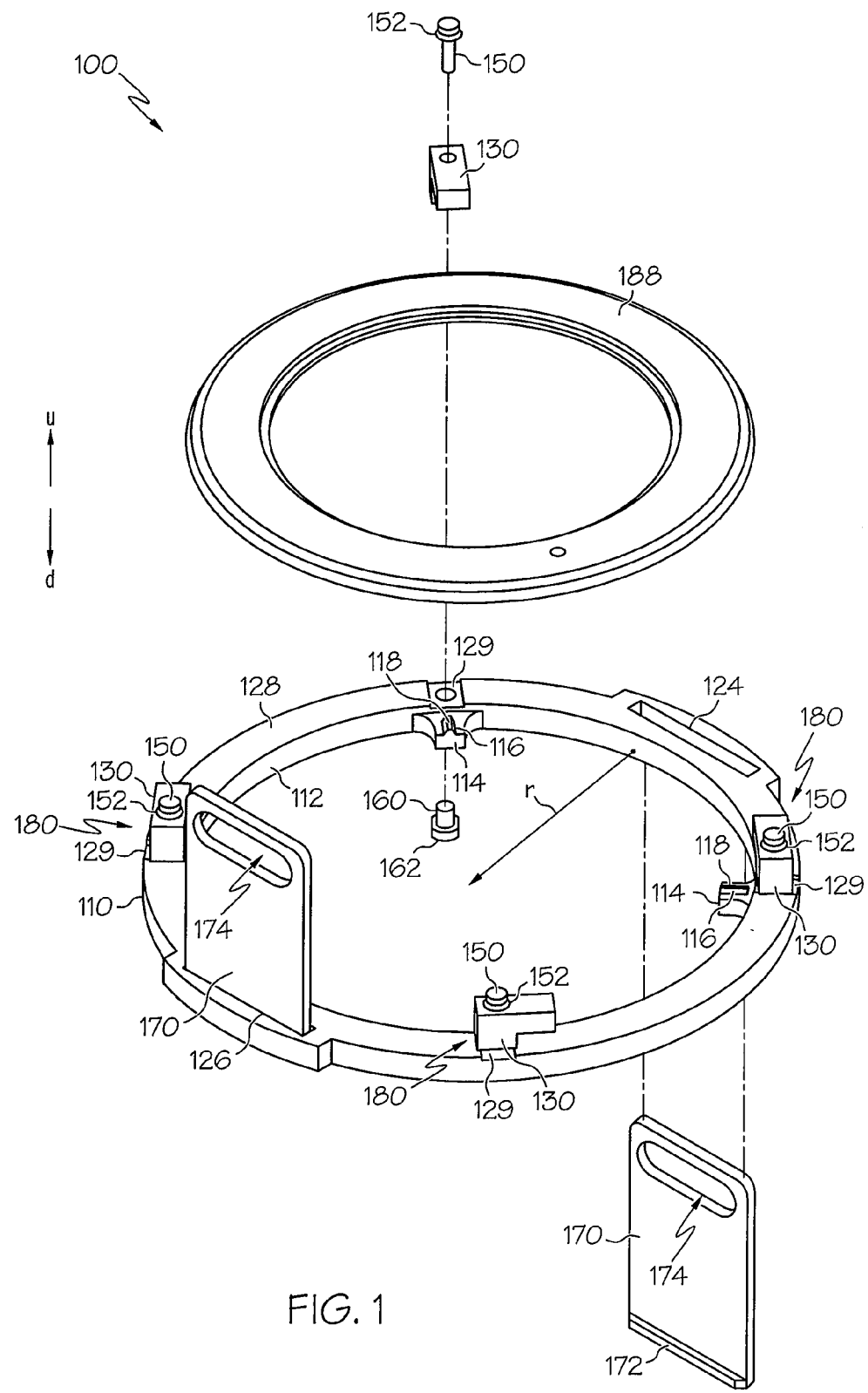
FIG. 1 illustrates a partially exploded view of an electrode carrier assembly with an electrode containment sidewall forming an inner radius.

As is illustrated in FIG. 1, the electrode carrying annulus 110 comprises an electrode containment sidewall 112 that may form an inner radius of the electrode carrying annulus 110. The electrode containment sidewall 112 is configured to limit radial movement of an electrode 188 carried by the electrode carrying annulus 110. For the purposes of describing and defining the present invention, it is noted that "radial" movement comprises movement in the plane of the carrier, with the "radially away" direction denoted in the FIGS. 1-3A as a vector r projecting from the electrode containment sidewall 112.

Figure 2:
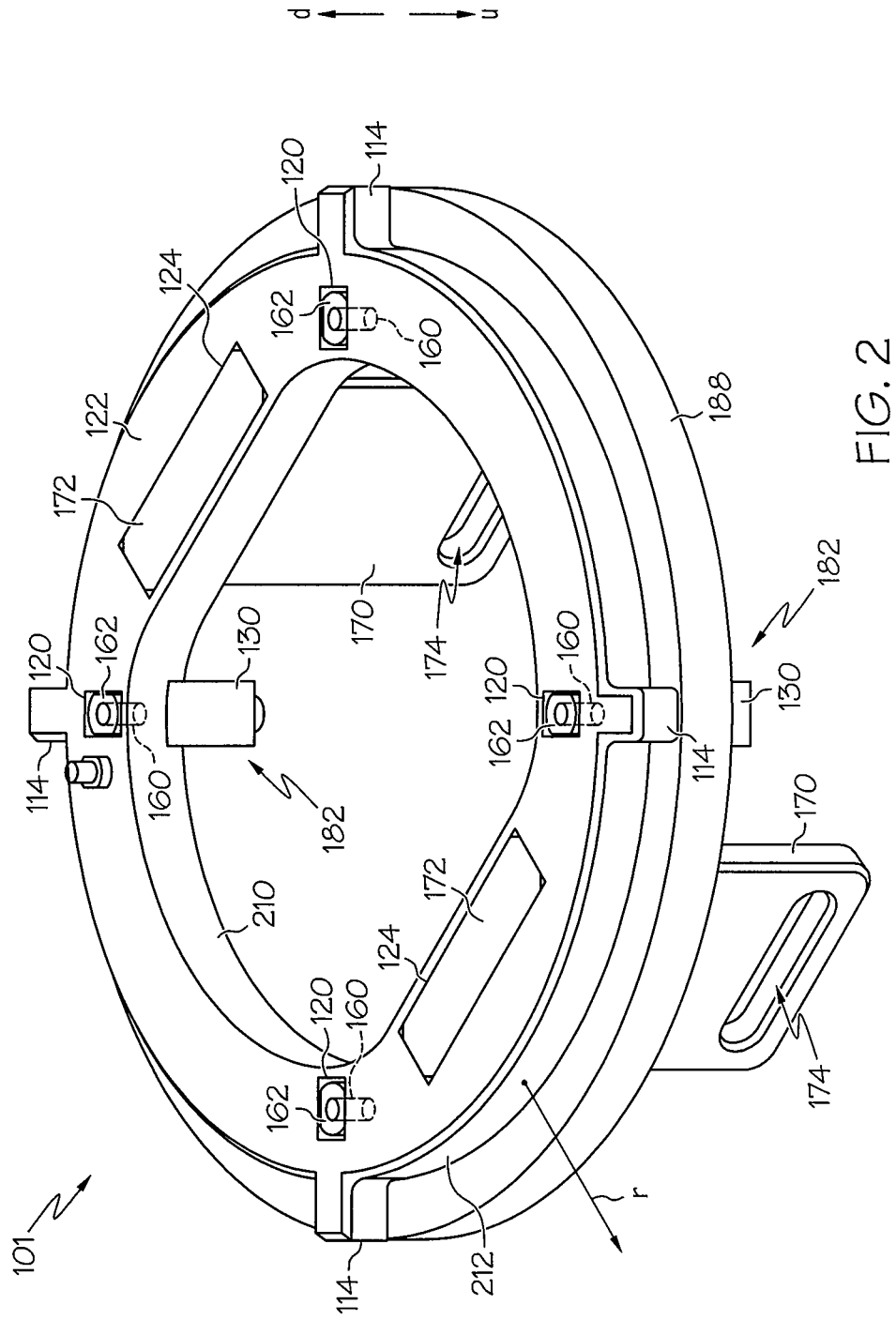
FIG. 2 illustrates a bottom perspective view of an electrode carrier assembly with an electrode containment sidewall forming an outer radius.

In another embodiment, depicted as a bottom perspective view in FIG. 2 for clarity, the electrode carrying annulus 210 comprises an electrode containment sidewall 212 that forms an outer radius of the electrode carrying annulus 210. The electrode containment sidewall 212 is configured to limit radial movement of an electrode 188 carried by the electrode carrying annulus 210.

Figure 3A:
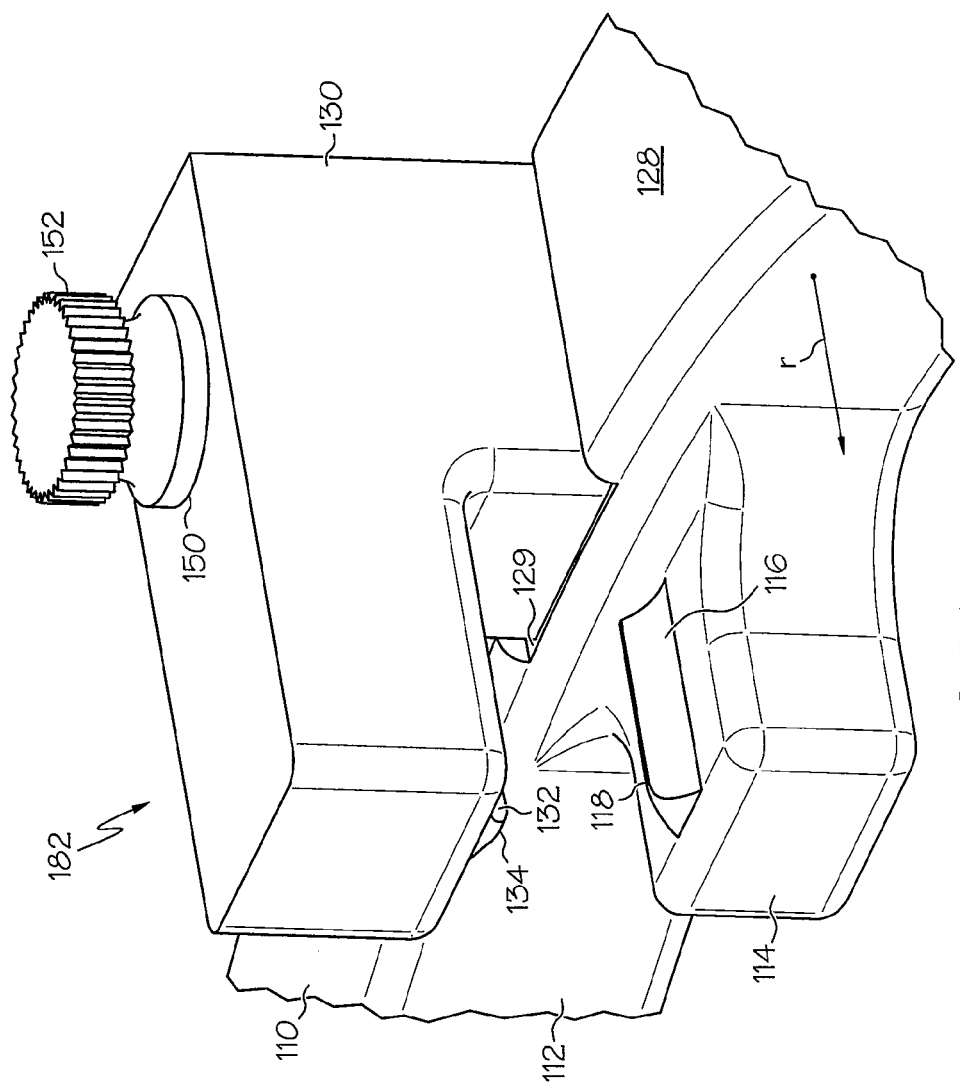
FIG. 3A illustrates an electrode mounting member of FIG. 1 in isolation.

The electrode carrying annulus 110, 210 further comprises a plurality of radial sidewall projections 114 that project radially away from the electrode containment sidewall 112, 212. FIGS. 1, 2 and 3A depict the radial sidewall projections 114, which each comprise an upward-facing tapered spacer 116. The upward-facing tapered spacer 116 comprises an upward-facing micro-mesa 118. The upward-facing tapered spacer 116 projects upwardly from the radial sidewall projections 114 and defines an upward-decreasing cross sectional area that culminates at the upward-facing micro-mesa 118. The radial sidewall projections 114 are configured to support the electrode 188 carried by the electrode carrying annulus 110, 210 and resting upon the upward-facing micro-mesa 118. As used herein, the terms "upward" or "upwardly" mean directed at or situated in a direction corresponding with the vector u as denoted in the FIGS. 1-4B. Similarly, the terms "downward" or "downwardly" mean directed at or situated in a direction corresponding with the vector d as denoted in the FIGS. 1-4B.

In the illustrated embodiments, the radial sidewall projections 114 comprise relatively discrete tabs but it is contemplated that the radial sidewall projections 114 may take a variety of forms and may be provided in a variety of numbers along the electrode containment sidewall 112, 212. For example, the radial sidewall projections 114 may be any form suitable to support the weight of an electrode or electrode assembly. Furthermore, the number of radial sidewall projections 114 may be increased or decreased depending on the structural strength of each radial sidewall projection 114, i.e. lower numbers for strong relative to the weight of the electrode and higher numbers for weak relative to the weight of the electrode.

The electrode mounting members 130 each comprise a downward-facing tapered spacer 132. The downward-facing tapered spacer 132 comprises a downward-facing micro-mesa 134. The downward-facing tapered spacer 132 projects downwardly from the electrode mounting members 130 and defines a downward-decreasing cross sectional area that culminates at the downward-facing micro-mesa 134. It is noted, that the term "micro-mesa," as used herein, means a substantially planar surface having a small surface area relative to the radial sidewall projections 114 that is configured to contact and support an electrode or electrode assembly. In some embodiments, the surface area of the micro-mesa may be minimized to the smallest surface area suitable to support the weight of an electrode or electrode assembly.

The electrode mounting members 130 are rotatably engaged with the electrode carrying annulus 110, 210. The electrode mounting members 130 are configured to rotate between a free position 180 and a bracketed position 182. In the free position 180, depicted in FIG. 1, the downward-facing micro-mesa 134 (not shown in FIG. 1) circumvents an upward projection of the electrode containment sidewall 112. In the bracketed position 182, depicted in FIG. 3A, the downward-facing micro-mesa 134 breaches the upward projection of the electrode containment sidewall 112 and limits upward movement of the electrode 188 carried by the electrode carrying annulus 110.

In one embodiment, the electrode carrying annulus 110 comprises a top surface 128 and upward-facing planar depressions 129 disposed within the top surface 128. In the free position 180, depicted in FIG. 1, the electrode mounting members 130 pivot upon the top surface 128. In the bracketed position 182, depicted in FIG. 3A, the electrode mounting members 130 pivot upon the upward-facing planar depressions 129. For example, as the electrode mounting members 130 rotate throughout the free position 180, the electrode mounting members 130 may be in contact with the top surface 128. Similarly, the electrode mounting members 130 may be in contact with the upward-facing planar depressions 129 as they rotate in the bracketed position 182.

In another embodiment, the radial sidewall projections 114, the electrode mounting members 130, or a combination thereof are not in contact with the electrode 188 carried by the electrode carrying annulus 110 when in the bracketed position 182. For example, the distance between the upward-facing micro-mesa 118 and the downward-facing micro-mesa 134 may be larger than thickness of a new electrode. Thus, the electrode carrier assembly 100 may be configured to carry the electrode as it gradually dissolves over its service lifetime.

Referring now to FIGS. 1 and 3A, embodiments of the present disclosure comprise a plurality of hand-operated screws 150 and a plurality of locking nut-plates 160. The hand-operated screws 150 are helically engaged with the locking nut-plates 160. For example, the hand-operated screws 150 and the locking nut-plates 160 may be correspondingly threaded and engaged with each other by a torque. The hand-operated screws 150 and the locking nut-plates 160 cooperate to provide a clamping force that clamps the electrode mounting members 130 to the electrode carrying annulus 110. The clamping force is adjusted by rotating the hand-operated screws 150. For instance, the clamping force may be increased by tightening the helical engagement between the hand-operated screws 150 and the locking nut-plates 160. Similarly, the clamping force may be decreased by loosening the helical engagement between the hand-operated screws 150 and the locking nut-plates 160.

In one embodiment, as shown in FIG. 3A, the hand-operated screws 150 each comprise a frictional gripping head 152. The frictional gripping head 152 is configured to be manually grasped to rotate the hand-operated screws 150. Specifically, the frictional gripping head 152 may be grooved to decrease the amount of pressure required to grasp the hand-operated screws 150 for tightening and loosening. Further, the amount of friction may be calibrated to accommodate a manual adjustment of the hand-operated screws 150 by a user wearing personal protection equipment such as, for example, gloves.

Referring again FIG. 2, in embodiments of the electrode carrier assembly 101 the locking nut-plates 160 comprise an interlocking flange 162, and the electrode carrying annulus 210 comprises an interlocking recess 120. The interlocking flange 162 and the interlocking recess 120 interlock to resist rotation of the locking nut-plates 160. The interlocking flange 162 is depicted in FIG. 2 as comprising a circular shape with machined-flat sides and the interlocking recess 120 is depicted in FIG. 2 as comprising a rounded-rectangular shape. However, it is noted that the interlocking flange 162 and the interlocking recess 120 may comprise any set of complimentary shapes that provide for surfaces that mutually oppose rotation such as, for example, hexagonal, square, star, rectangular or any other shapes comprising a rectilinear surface.

In another embodiment, the locking nut-plates 160 are upwardly-recessed within the interlocking recess 120. The locking nut-plates 160 are disposed upward of a bottom surface 122 of the electrode carrying annulus 110. As a result, when the bottom surface 122 of the electrode carrying annulus 210 is placed upon a substantially flat surface, the bottom surface 122 is in contact with the substantially flat surface and the locking nut-plates 160 are not in contact with the substantially flat surface.

Figure 3B:
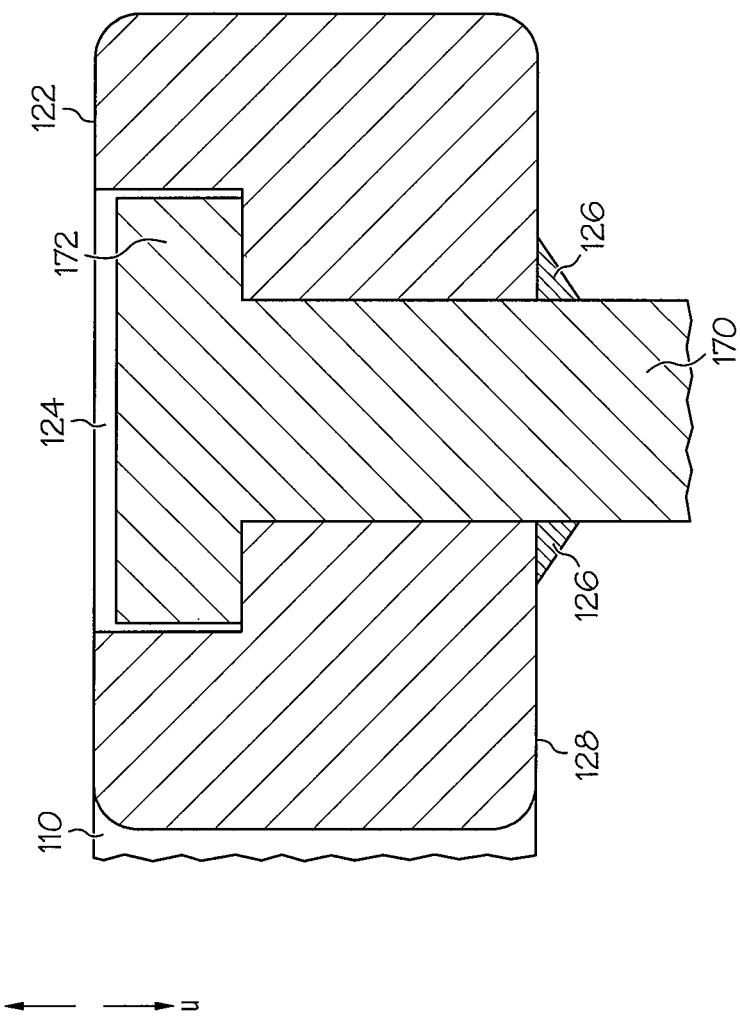
FIG. 3B illustrates a cross-section of an upward-projecting handle of FIG. 1 in isolation.

Referring collectively to FIGS. 1 and 3B, an embodiment of the electrode carrier assembly 100 comprises an upward-projecting handle 170 and a carrying aperture 174 disposed upward of the electrode carrying annulus 110 and the electrode carrying annulus 110 comprises a handle accepting aperture 124. The upward-projecting handle 170 comprises a base flange 172. The handle accepting aperture 124 is contoured to accept the base flange 172. The base flange 172 is seated within the handle accepting aperture 124, such that the upward-projecting handle 170 is disposed upward of the bottom surface 122 of the electrode carrying annulus 110. Therefore, the upward-projecting handle 170 may provide an offset that allows a user to manipulate an electrode carried by the electrode carrying annulus 110. While the base flange 172 is depicted in FIG. 3B as having a substantially "T" shaped cross section, it is noted that the base flange 172 may comprise any cross section that provides suitable structural support such as, for example, an "L" shape, a wedge shape, and the like.

In another embodiment, the electrode carrier assembly 100 comprises a welded joint 126 disposed around the handle accepting aperture 124. The welded joint 126 fuses the upward-projecting handle 170 to the top surface 128 of the electrode carrying annulus 110. The welded joint 126 may be configured to provide a joint that adheres the upward-projecting handle 170 to the electrode carrying annulus 110 and a seal that prevents the seepage of solid or liquid materials into the handle accepting aperture 124.

Figure 4B:
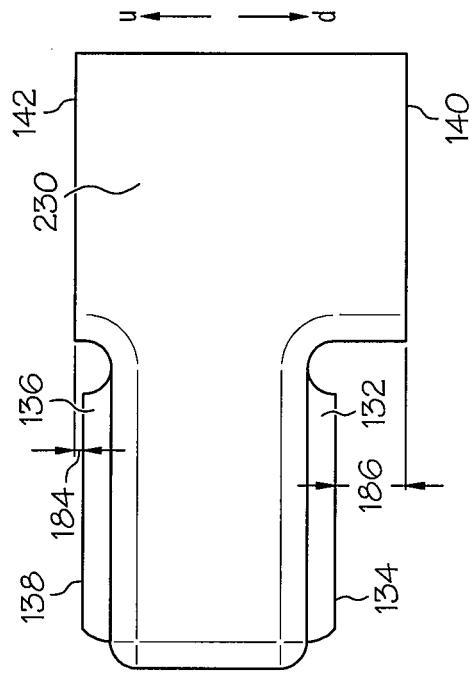
FIGS. 4A and 4B illustrate an electrode mounting member in isolation.
Figure 4A:
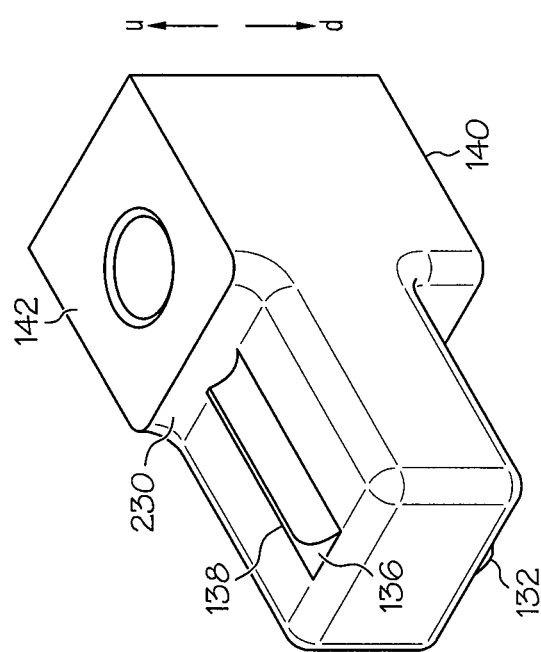

Referring now to FIGS. 4A and 4B, the electrode mounting members 230 may each comprise an alternative tapered spacer 136. The alternative tapered spacer 136 comprises an alternative micro-mesa 138. The alternative tapered spacer 136 projects upwardly from the electrode mounting members 230 and defines an alternative upward-decreasing cross sectional area that culminates at the alternative micro-mesa 138 that faces upward.

In some embodiments of the present disclosure, the electrode mounting members 230 comprise a downward-facing mounting surface 140 and an upward-facing mounting surface 142. The downward-facing micro-mesa 134 is spaced an upward distance 186 away from the downward-facing mounting surface 140 along the upward direction. The alternative micro-mesa 138 is spaced a downward distance 184 away from the upward-facing mounting surface 142 along the downward direction. The upward distance 186 is different from the downward distance 184.

For example, referring collectively to FIGS. 1, 4A and 4B, the electrode carrier assembly 100 may be configured to hold electrodes with different thicknesses, i.e. electrodes with different designs or part numbers, by reversing the electrode mounting members 230. The electrode mounting members 230 may be reversed by alternating which of the downward-facing mounting surface 140 and the upward-facing mounting surface 142 is in contact with the electrode carrying annulus 110. It is noted that, while the upward distance 186 is depicted as being larger than the downward distance 184 in FIG. 4B, the upward distance 186 and the downward distance 184 may each be any length. Furthermore, the nomenclature is merely used to establish a reference system, thus the upward distance 186 and the downward distance 184 may either upward or downward. Therefore, the downward-facing micro-mesa 134 may be either upward or downward of the downward-facing mounting surface 140. Similarly, the alternative micro-mesa 138 may be either upward or downward of the upward-facing mounting surface 142.

It is noted that, while the tapered spacers 116, 132 and 136 are shown and described herein as comprising a decreasing cross sectional area, it is contemplated that the tapered spacers 116, 132 and 136 may comprise any shape suitable for supporting a micro-mesa in contact with an electrode. Such shapes include, but are not limited to, "I" beam, cylindrical, uniform cross section, spherical, and the like.

To reduce the possibility of contamination during reconditioning procedures, the various assembly components described herein can be fabricated using materials that are resistant to oxidation or other process-related degradation. For example, and not by way of limitation, the materials should be chemically resistant to isopropyl alcohol, sulfuric acid, hydrogen peroxide, hydrofluoric acid, nitric acid, acetic acid, and the like. Suitable materials include, but are not limited to, engineering polymers such as acrylonitrile butadiene styrene, polypropylene homopolymer, polypropylene random copolymer, polypropylene block copolymer, low-density polyethylene or high-density polyethylene It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

For the purposes of describing and defining the present disclosure it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. An electrode carrier assembly comprising an electrode carrying annulus and a plurality of electrode mounting members, wherein:
    the electrode carrying annulus comprises an electrode containment sidewall that forms an inner or outer radius of the electrode carrying annulus;
    the electrode containment sidewall is configured to limit radial movement of an electrode carried by the electrode carrying annulus;
    the electrode carrying annulus further comprises a plurality of radial sidewall projections that project radially away from the electrode containment sidewall;
    the radial sidewall projections each comprise an upward-facing tapered spacer;
    the upward-facing tapered spacer comprises an upward-facing micro-mesa, such that the upward-facing tapered spacer projects upwardly from the radial sidewall projections and defines an upward-decreasing cross sectional area that culminates at the upward-facing micro-mesa;
    the radial sidewall projections are configured to support the electrode carried by the electrode carrying annulus and resting upon the upward-facing micro-mesa;
    the electrode mounting members each comprise a downward-facing tapered spacer;
    the downward-facing tapered spacer comprises a downward-facing micro-mesa, such that the downward-facing tapered spacer projects downwardly from the electrode mounting members and defines a downward-decreasing cross sectional area that culminates at the downward-facing micro-mesa;
    the electrode mounting members are rotatably engaged with the electrode carrying annulus, such that the electrode mounting members are configured to rotate between a free position and a bracketed position;
    in the free position, the downward-facing micro-mesa circumvents an upward projection of the electrode containment sidewall; and
    in the bracketed position, the downward-facing micro-mesa breaches the upward projection of the electrode containment sidewall and limits upward movement of the electrode carried by the electrode carrying annulus.

2. The electrode carrier assembly of claim 1 wherein:
    the electrode carrying annulus comprises a top surface and upward-facing planar depressions disposed within the top surface;
    in the free position, the electrode mounting members pivot upon the top surface; and in the bracketed position, the electrode mounting members pivot upon the upward-facing planar depressions.

3. The electrode carrier assembly of claim 1 wherein the radial sidewall projections, the electrode mounting members, or a combination thereof are not in contact with the electrode carried by the electrode carrying annulus when in the bracketed position.

4. The electrode carrier assembly of claim 1 further comprising a plurality of hand-operated screws and a plurality of locking nut-plates, wherein:
    the hand-operated screws are helically engaged with the locking nut-plates;
    the hand-operated screws and the locking nut-plates cooperate to provide a clamping force that clamps the electrode mounting members to the electrode carrying annulus; and
    the clamping force is adjusted by rotating the hand-operated screws.

5. The electrode carrier assembly of claim 4 wherein:
    the hand-operated screws each comprise a frictional gripping head; and
    the frictional gripping head is configured to be manually grasped to rotate the hand-operated screws.

6. The electrode carrier assembly of claim 4 wherein:
    the locking nut-plates comprise an interlocking flange;
    the electrode carrying annulus comprises an interlocking recess; and
    the interlocking flange and the interlocking recess interlock to resist rotation of the locking nut-plates.

7. The electrode carrier assembly of claim 6 wherein the locking nut-plates are upwardly-recessed within the interlocking recess, such that the locking nut-plates are disposed upward of a bottom surface of the electrode carrying annulus.

8. The electrode carrier assembly of claim 1 further comprising an upward-projecting handle, wherein:
    the upward-projecting handle comprises a base flange and a carrying aperture disposed upward of the electrode carrying annulus;
    the electrode carrying annulus comprises a handle accepting aperture contoured to accept the base flange;
    the base flange is seated within the handle accepting aperture; and
    the upward-projecting handle is disposed upward of a bottom surface of the electrode carrying annulus.

9. The electrode carrier assembly of claim 8 further comprising a welded joint disposed around the handle accepting aperture, wherein the welded joint fuses the upward-projecting handle to a top surface of the electrode carrying annulus.

10. The electrode carrier assembly of claim 1, wherein:
the electrode mounting members each comprise an alternative tapered spacer;
the alternative tapered spacer comprises an alternative micro-mesa, such that the alternative tapered spacer projects upwardly from the electrode mounting members and defines an alternative upward-decreasing cross sectional area that culminates at the alternative micro-mesa; and
the alternative micro-mesa faces upward.

11. The electrode carrier assembly of claim 10, wherein:
the electrode mounting members comprise a downward-facing mounting surface and an upward-facing mounting surface;
the downward-facing micro-mesa is spaced an upward distance away from the downward-facing mounting surface along an upward direction;
the alternative micro-mesa is spaced a downward distance away from the upward-facing mounting surface along a downward direction; and
the upward distance is different from the downward distance.

12. The electrode carrier assembly of claim 1, further comprising an engineering polymer.

13. An electrode carrier assembly comprising an electrode carrying annulus, a plurality of electrode mounting members, and a plurality of hand-operated screws wherein:
the electrode carrying annulus comprises an electrode containment sidewall that forms an inner or outer radius of the electrode carrying annulus;
the electrode containment sidewall is configured to limit radial movement of an electrode carried by the electrode carrying annulus;
the electrode carrying annulus further comprises a top surface, upward-facing planar depressions disposed within the top surface and a plurality of radial sidewall projections that project radially away from the electrode containment sidewall;

the radial sidewall projections each comprise an upward-facing tapered spacer;
the upward-facing tapered spacer comprises an upward-facing micro-mesa, such that the upward-facing tapered spacer projects upwardly from the radial sidewall projections and defines an upward-decreasing cross sectional area that culminates at the upward-facing micro-mesa;
the radial sidewall projections are configured to support the electrode carried by the electrode carrying annulus and resting upon the upward-facing micro-mesa;
the electrode mounting members each comprise a downward-facing tapered spacer;
the downward-facing tapered spacer comprises a downward-facing micro-mesa, such that the downward-facing tapered spacer projects downwardly from the electrode mounting members and defines a downward-decreasing cross sectional area that culminates at the downward-facing micro-mesa;
the hand-operated screws provide a clamping force that clamps the electrode mounting members to the electrode carrying annulus;
the clamping force is adjusted by rotating the hand-operated screws;
the electrode mounting members are rotatably engaged with the electrode carrying annulus, such that the electrode mounting members are configured to rotate between a free position and a bracketed position;
in the free position, the electrode mounting members pivot upon the top surface, and the downward-facing micro-mesa circumvents an upward projection of the electrode containment sidewall; and
in the bracketed position, the electrode mounting members pivot upon the upward-facing planar depressions, and the downward-facing micro-mesa breaches the upward projection of the electrode containment sidewall and limits upward movement of the electrode carried by the electrode carrying annulus.

* * * * *